United States Patent

Pritchard

Patent Number: 6,057,737
Date of Patent: May 2, 2000

[54] NON-LINEAR ASYMMETRICAL AUDIO AMPLIFIERS

[76] Inventor: Eric K. Pritchard, Rte. 6 Box 11420, Berkeley Springs, W. Va. 25411

[21] Appl. No.: 09/172,558
[22] Filed: Oct. 14, 1998
[51] Int. Cl.[7] .................................................. H03F 3/16
[52] U.S. Cl. ........................................ 330/300; 330/300
[58] Field of Search ............................ 330/110, 300, 330/301, 311

[56] References Cited

U.S. PATENT DOCUMENTS

| | | | |
|---|---|---|---|
| 4,511,861 | 4/1985 | Bell | 330/300 |
| 4,524,331 | 6/1985 | Faith | 330/311 |
| 4,939,478 | 7/1990 | Heimsch et al. | 330/300 |
| 5,053,718 | 10/1991 | Graeme et al. | 330/311 |
| 5,471,168 | 11/1995 | Sevenhans et al. | 330/305 |

*Primary Examiner*—Robert Pascal
*Assistant Examiner*—Khanh Van Nguyen

[57] ABSTRACT

Non-linear asymmetric amplifiers incorporate different non-linear characteristics in single ended or differential configurations to avoid cancellation of non-linear characteristics and to produce the harmonic structures of vacuum tubes. The operating currents of the asymmetrical devices are different to create a bias shift in the coupling capacitance between the asymmetrical devices.

21 Claims, 4 Drawing Sheets

NON-LINEAR ASYMMETRICAL AUDIO AMPLIFIERS

BACKGROUND

This invention relates to audio amplifiers and non-linear amplifiers, and more specifically, to capacitively coupled asymmetrical differential amplifiers with a capacitor bias that is altered by an asymmetrical means to produce a bias shift as a function of signal level.

THE OBJECTS OF THIS INVENTION

An object of this invention is an amplifier having a first and second non-linear means having fundamentally different non-linear characteristics which are capacitively coupled and having resistor means for setting and optionally adjusting the operating points of the non-linear means.

An object of this invention is an asymmetrical differential amplifier having dissimilar technology transistors.

A further object of this invention is a condenser microphone amplifier with optional filtering and proportional DC—DC converter for biasing the condenser capsule.

THE PRIOR ART

The prior art field effect transistor amplifiers have biasing difficulties. One solution uses a current source to set the source current. However, the variance in field effect transistor parameters produces unpredictable results when the amplifier is overdriven.

The prior art of condenser microphone amplifiers is filled with a variety of linear amplifiers constructed, of course, with some non-linear elements. The non-linearity of these elements have generally been minimized by various feedback methods to meet the accepted engineering paradigm of replication without embellishment. However, there is a demand for an artistic replication with certain embellishments.

The prior art of microphone amplifiers is exemplified by the recent Neumann introduction of a microphone with a noise floor below the threshold of hearing ability and minimal distortion even at the threshold of hearing pain. It is meant to be the transparent conduit of sound waves into electrical waves.

The prior art tube amplifiers generally use a single stage to receive, with its high input impedance, the signal from a condenser microphone capsule and drive a line matching transformer with its output. The circuits vary from grounded cathode to cathode follower.

The prior art in non-linear amplifiers includes a vast body of operational amplifiers with non-linear feedback. In a slightly different tact is my patent on the "Semiconductor Emulation of Vacuum Tubes", U.S. Pat. No. 5,434,536.

The prior art in differential amplifiers uses the same type of device on both sides since their non-linearities tend to cancel. This can be readily seen in the differential phase splitter. Whereas the individual triodes distort significantly at high levels, the differential pair does not. Of course, the differential pair does follow the engineering paradigm.

THE EMBODIMENTS OF INVENTION

Figure 1:
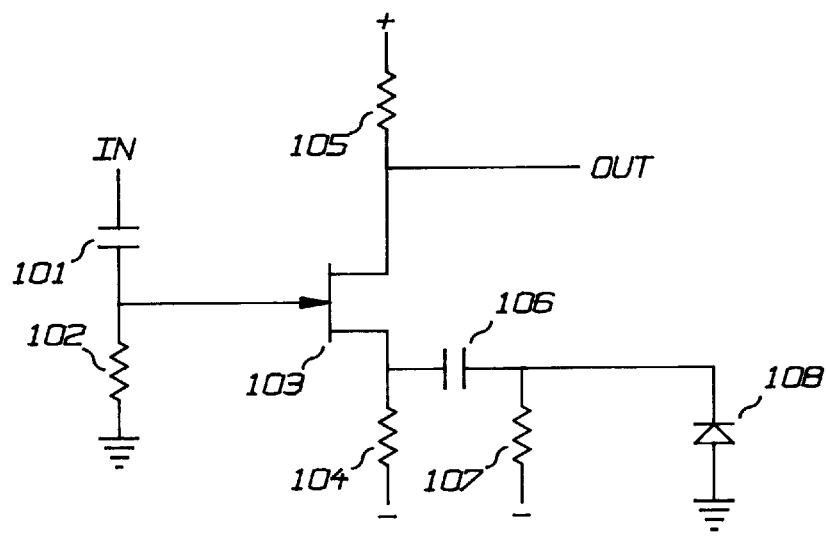
FIG. 1 is a schematic of a basic single-ended amplifier having the biasing and limiting techniques of the present invention.

FIG. 1 shows the most fundamental embodiment of this invention. It is a capacitively coupled field effect transistor stage with a variation from a standard source circuit. Capacitor 101 couples the input to the gate of FET 103 and to a gate biasing resistor 102. The drain has a load resistor 105 that is also connected to a positive supply. The drain is also connected to the output. The source has a resistor 104 that is connected to a negative supply. The combination provides the DC bias for the FET 103 and thereby sets its operating point. This resistor is bypassed by capacitor 106. In the prior art, capacitor 106 would be connected to ground or be in series with a resistor to ground. However, the present invention uses the combination of resistor 107, the negative supply, and a non-linear means represented by the diode 108. Resistor 107 and the negative supply set the operating point of the diode 108 or other non-linear device in this position. The maximum current through the FET 103 is the sum of the currents in resistors 104 and 107. Please note that resistors 104 and 107 could be current sources also such as found in FIG. 5. Further, if the gain is too high, the capacitor 106 may include a resistor in series to reduce the gain.

The circuit operates as the prior art until the FET is driven hard. When the gate goes positive, and if the drain load resistor 105 is sufficiently low, then the diode 108 or other non-linear device in that position, will stop conducting and the capacitor will charge through resistor 107. If the gate is driven negative to cut off, then the capacitor is charged in the opposite polarity through resistor 104. If these charging currents are not equal, the nominal voltage on capacitor 106 will shift and its shifts as a function of the input as well as circuit element values.

The non-linear characteristics of the FET 103 and the diode 108 are fundamentally different. The transconductance of the FET is approximately square law while the diode is exponential.

Figure 2:
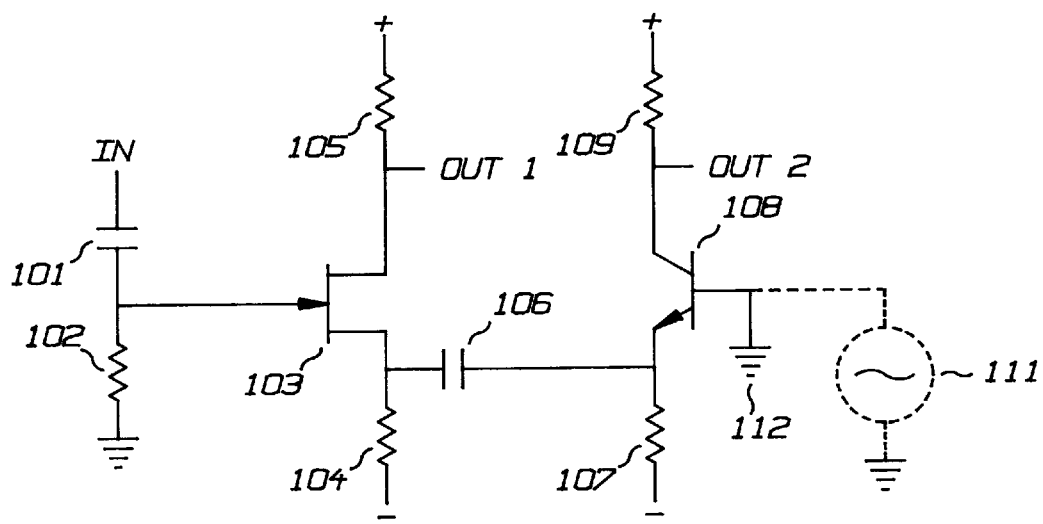
FIG. 2 is a schematic of a basic balanced output amplifier that is an extension of FIG. 1.

FIG. 2 is similar to FIG. 1 except that the diode has been replaced by a transistor 108 that has a load resistor 109. The output is fairly balanced, particularly if resistors 104 and 107 have rather large values or are current sources.

Normally a differential amplifier such as FIG. 2 uses similar devices, not dissimilar devices. The use of similar devices such as a pair of vacuum triodes in a phase splitter, cancels most the event harmonic production. The use of dissimilar devices maintains much of the even harmonic production, although it may be necessary to enhance the production of harmonics to attain the peculiar harmonic structure of vacuum tubes: with the 2nd harmonic is 30 db below the fundamental, then the 3rd harmonic should be about 50 db below the fundamental.

The non-linear characteristics of the FET 103 and the bipolar transistor 108 are fundamentally different. The transconductance of the FET is approximately square law while the bipolar transistor is exponential.

The First Microphone Embodiment

Figure 3:
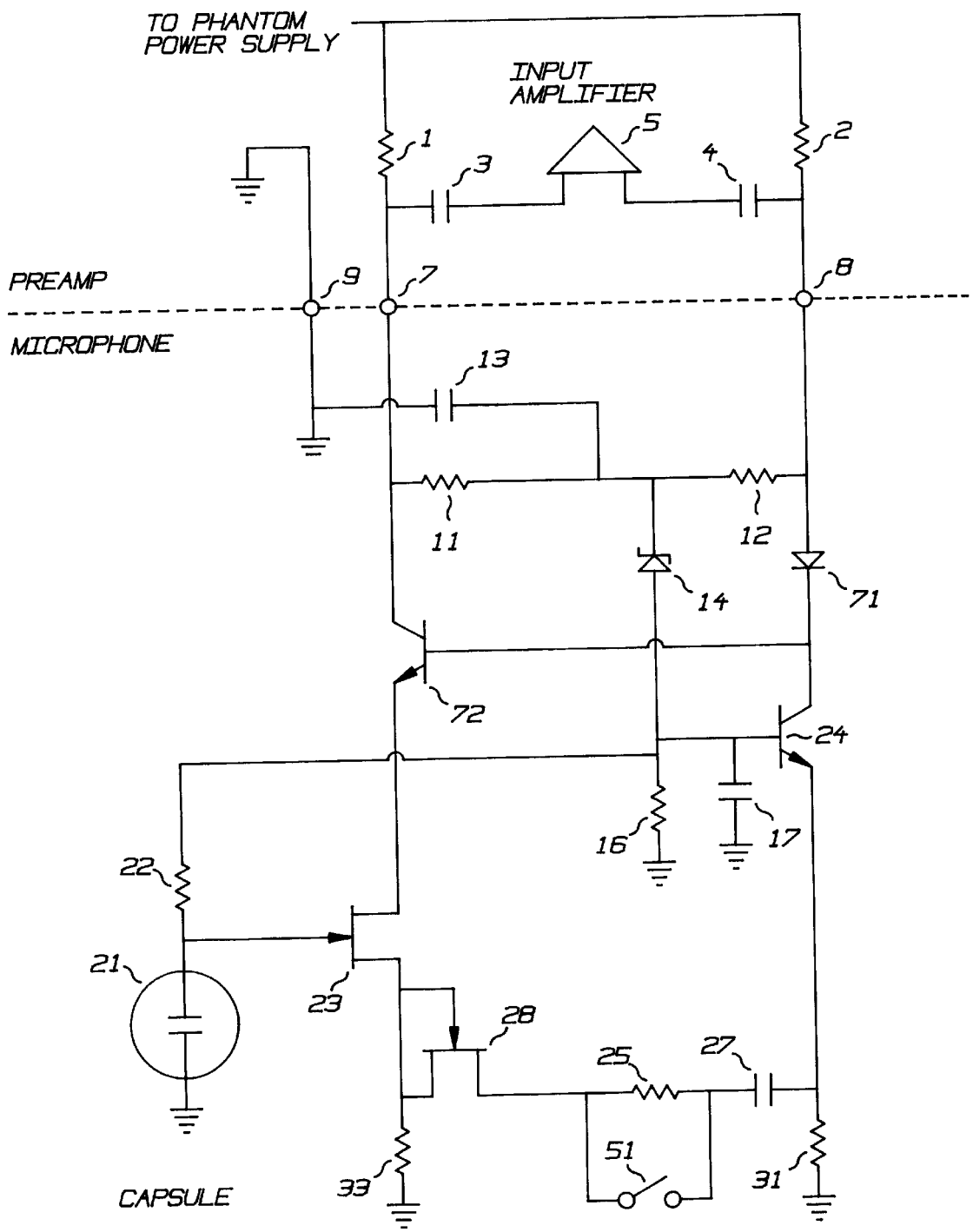
FIG. 3 is a schematic of an asymmetrical differential amplifier for a condenser microphone including harmonic creation means.

FIG. 3 shows the first microphone embodiment, a condenser microphone amplifier connected to a preamplifier having phantom power. The phantom power standard includes two resistors 1 and 2 which connect terminals 7 and 8 of the microphone connector to a power supply of approximately 50 volts. The signal is then extracted from the terminals with capacitors 3 and 4 which couple terminals 7 and 8 to the inputs of amplifier 5. Pin 9 provides a ground return for the phantom power.

The microphone amplifier has two resistors, 11 and 12, to receive the phantom power. They are connected together to provide operational power to the amplifier, ie. transistor bias currents. The DC bias at this junction is further lowered by zener 14 to provide bias for the differential amplifier. Any residual audio is filtered by capacitor 17. Resistor 16 ensures a minimum current in the zener 14.

The bias voltage is connected to the microphone capsule 21 through resistor 22. Resistor 22 is usually between a few tens of megohms and gigohm. The capsule operates on the premise that the change in capacitance produces a change in capacitor voltage if there is nowhere for the current to flow, hence the requirement for an extremely high resistance value. The capsule voltage is sensed by the field effect transistor 23. This transistor is paired with a bipolar transistor 24 to produce a balanced output on terminals 7 and 8. Transistors 23 and 24 are coupled by resistor 25, the capacitor 27, and the optional non-linear resistance 28. The DC current for the bipolar transistor 24 is provided by resistor 31 while the DC current for the field effect transistor 23 is provided by resistor 33. By making resistors 31 and 33 large, much larger than the resistance of 25 and optionally 28, the gain at DC is much smaller than the audio gain.

The asymmetrical pair of transistors 23 and 24 creates even harmonics as well as odd harmonics while producing a balanced output whereas the standard practice of using a symmetrical pair would produce only odd harmonics. Since this amplifier is supposed to replicate the vacuum tube condenser microphone amplifiers of yesterday, and since the low-order even harmonic structure is quite desirable, and since it is desirable to have a balanced output, it is necessary to use devices with substantially different characteristics such as the preferred field effect and bipolar transistors.

The resistor 25, optional non-linear resistance 28, the transconductance of the FET 23, and the emitter resistance of transistor 24 controls the mid-frequency gain. Switch 51 when closed can increase the gain by removing resistor 25. Capacitor 27 is needed because the source of the field effect transistor 23 will be a substantially different voltage than the emitter of the bipolar transistor 24, at least when the amplifier is not clipping.

The optional non-linear resistance 28 is a field effect transistor wired with its gate connected to its drain. This non-linearity adds to the non-linearity of the field effect transistor 23. It has been found that this is necessary to attain the harmonic structure of vacuum tubes. The harmonic structure of triode vacuum tubes generally has a third harmonic level of approximately 50 dB below the fundamental when the second harmonic is 30 dB below the fundamental.

Alternatively or additionally, one can use the cascode transistor 72 with it base connected to a signal that is in-phase with the base and source of field effect transistor 23. This cascode connection keeps the drain-source voltage from dropping as far when the gate voltage goes up. In fact, the drain-source voltage can be kept approximately constant or even rise with rising gate voltage. This connection makes the FET 23 more non-linear and may be needed to achieve the nominal tube harmonic characteristic.

The capacitive coupling by capacitor 27 precludes the standard bias shifting approaches to the input capacitor, ie. the capsule 21, since capacitor 27 will charge to compensate. Consequently, the charge on capacitor 27 must be altered. The asymmetrical arrangement of the field effect transistor 23 and the bipolar transistor 24 plus the square law behavior of the field effect transistor will charge capacitor 27 to effect a bias shift. Further, the bias shift is controlled by the ratio of the resistors 31 and 33 as well as the input. If they are the same, then there is little bias shift in capacitor 27. If they are unequal, then the current charging capacitor 27 will not be the same as the current discharging it. The result is a substantial bias shift that appears on the overdrive of this circuit.

Figure 4:
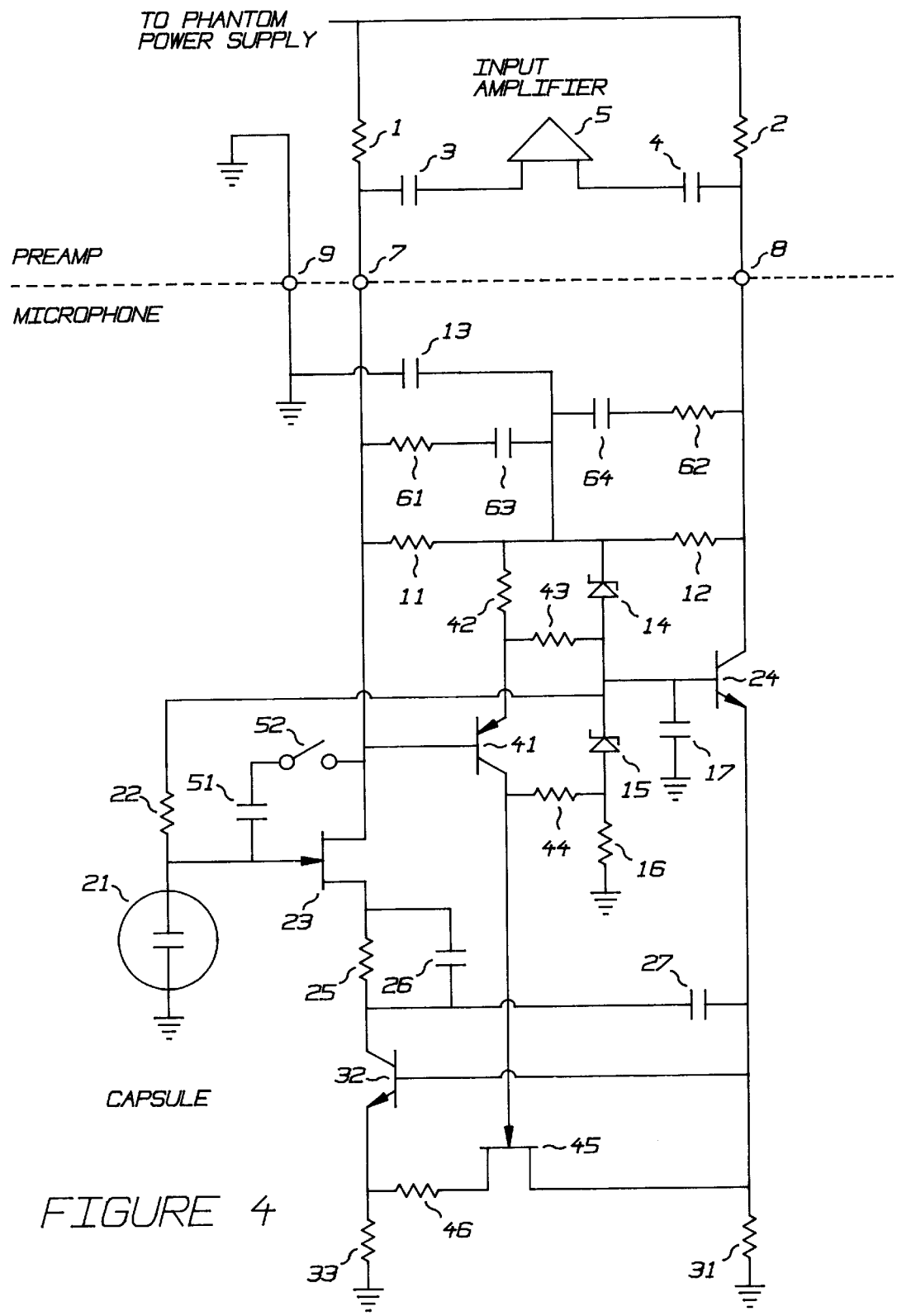
FIG. 4 is a schematic of an asymmetrical differential amplifier with level dependant bias shifting of a capacitive coupling in a condenser microphone embodiment.

The Embodiment of FIG. 4

The bias shifting can be further enhanced with additional circuitry as shown in FIG. 4. The capacitor 27 can be given additional charge with the following circuitry: Transistor 41 detects a large, negative going signal and turns on, ie., when the capsule voltage swings high as it would to produce grid conduction, field effect transistor 23 draws more current and lowers the voltage on the base of the PNP transistor 41. If sufficiently low as determined by the base-emitter voltage, the voltage of zener 14, and resistors 42 and 43, then the PNP transistor 41 conducts current to raise the voltage across the collector load resistor 44. When this voltage becomes sufficiently high a second field effect transistor 45 turns on and conducts current from the emitter of transistor 32 effectively to capacitor 27. Thus, the current that was flowing through transistor 32 and bypassing capacitor 27 is now flowing in that capacitor and charging it. This charge shifts the bias that sets the operating point of the differential pair 23 and 24. Consequently, the field effect transistor will present the capsule with a higher cut-off voltage. This will produce the well-known change in harmonic structure by driving the amplifier further into or towards cutoff.

The asymmetry can be further enhanced by making resistor 31 smaller than 33 so that transistor 24 will not be cut off as readily as the field effect transistor 23.

Many studio microphones are provided with an attenuator. This is done by switching in capacitive feedback using capacitor 51 and switch 52. In this case, the feedback will also change the harmonic structure and make the harmonics rise at higher levels but faster.

The bass response of the microphone can be raised relative to the treble frequencies by using the resistor-capacitor networks made of components 61–64. The capacitors lower the gain at high frequencies by including resistors 61 and 62 with resistors 1, 2, 11, and 12 as the drain and collector load resistors. Note, it is also possible to do this function with a single resistor and capacitor if they connect between pins 7 and 8 without connecting to the bias supply.

The testing of this amplifier with a capacitively coupled signal generator shows that it can be used in a wide variety of applications, for example a direct box or instrument amplifier.

Figure 5:
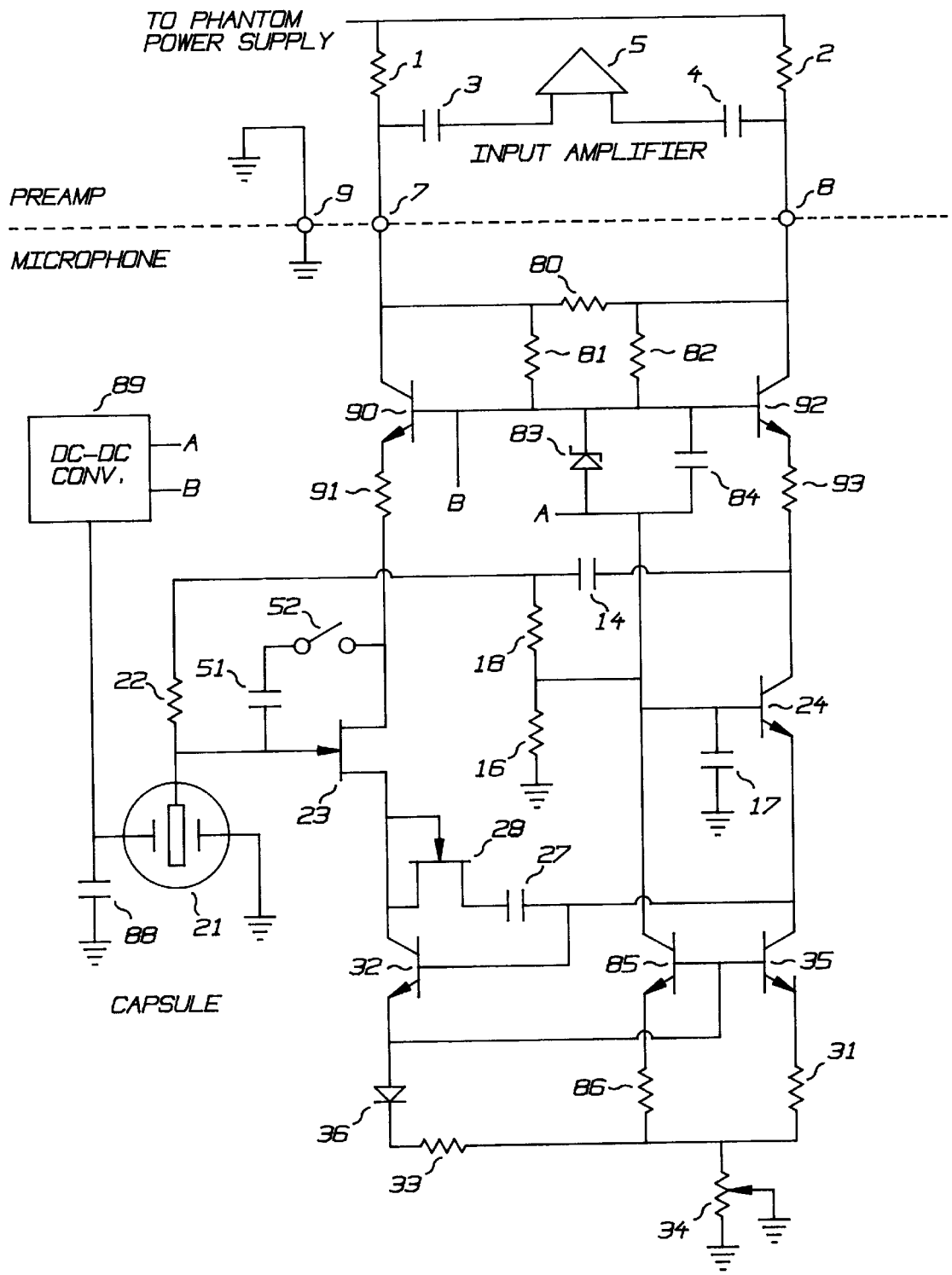
FIG. 5 is a schematic of an asymmetrical differential amplifier for a condenser microphone embodiment having variable headroom and filtering.

The Embodiment of FIG. 5

FIG. 5 shows the last microphone embodiment, a variable pattern condenser microphone amplifier connected to a phantom-power preamplifier. The phantom power standard includes two resistors 1 and 2 (6,810 ohms each) that connect terminals 7 and 8 of the microphone connector to a power supply of approximately 50 volts. The signal is then extracted from the terminals with capacitors 3 and 4 that couple terminals 7 and 8 to the inputs of amplifier 5. Pin 9 provides a ground return for the phantom power.

The microphone amplifier has a resistor 80 which is the differential load resistor and two resistors, 81 and 82, to receive the phantom power. They are connected together to provide operational power to the amplifier. The voltage at the terminal of resistors 81 and 82 bias the cascode transistors 90 and 92. The power is further lowered by zener 83 and filtered by 84. This lowered level biases the field effect transistor 23 and bipolar transistor 24 and is filtered by capacitor 17. Resistor 16, transistor 85 and resistor 86 insure current flows in the zener 83 and sets the voltage drop in resistors 81 and 82.

The bias voltage to transistor 24 is connected to the microphone capsule 21 through resistors 18 and 22. Resistor 18 can be a wide variety of values, but 1 megohm works quite well. This transistor is paired with a bipolar transistor 24 to produce a balanced output on terminals 7 and 8 via resistors 91 and 92 and cascode transistors 90 and 92. Transistors 23 and 24 are coupled by the capacitor 27, and the non-linear resistance 28. The DC current for the bipolar transistor 24 is provided by resistor 31 and transistor 35 while the DC current for the field effect transistor 23 is provided by resistor 33, diode 36, and transistor 32. The collectors of transistors 32 and 36, even with relatively small resistors 31 and 33, exhibit very high impedances and look like current sources. This makes the DC gain very small while the above coupling network makes the audio gain higher.

The asymmetrical pair of transistors 23 and 24 creates even harmonics as well as odd harmonics while producing a balanced output whereas the standard practice of using a symmetrical pair would produce only odd harmonics. Since this amplifier is supposed to replicate the vacuum tube condenser microphone amplifiers of yesterday, and since the low-order even harmonic structure is quite desirable, and since it is desirable to have a balanced output, it is necessary to use devices with substantially different characteristics such as the preferred field effect and bipolar transistors.

The non-linear resistance 28, the transconductance of the FET 23, and the emitter resistance of transistor 24 controls the mid-frequency gain. Capacitor 27 is needed because the source of the field effect transistor 23 will be a substantially different voltage than the emitter of the bipolar transistor 24, at least when the amplifier is not clipping.

The non-linear resistance 28 is a field effect transistor wired with its gate connected to its drain. This non-linearity adds to the non-linearity of the field effect transistor 23. It has been found that this is necessary to attain the harmonic structure of vacuum tubes. The harmonic structure of triode vacuum tubes generally has a third harmonic level of about 50 dB below the fundamental when the second harmonic is 30 dB below the fundamental.

The capacitive coupling by capacitor 27 precludes the standard bias shifting approaches to the input capacitor, ie. the capsule 21, since capacitor 27 will charge to compensate. Consequently, the charge on capacitor 27 must be altered. The asymmetrical arrangement of the field effect transistor 23 and the bipolar transistor 24 plus the square law behavior of the field effect transistor will charge capacitor 27 to effect a bias shift. Further, the bias shift is controlled by the ratio of the resistors 31 and 33 as well as the input. If they are the same then there is little bias shift in capacitor 27. If they are unequal then the current charging capacitor 27 will not be the same as the current discharging it. The result is a substantial bias shift that appears on the overdrive of this circuit.

Another important feature of microphones is a low-frequency high-pass filter. The filter within FIG. 5 is a variation on the Sallen-Key. The in-phase output is coupled into the bias circuit by capacitor 14 for the required feedback. The amount of feedback is set by the resistor 93. The time constant of capacitor 14 and resistor 18 should be much longer than the time constants of the filter. The bias resistor 22 and the capacitance of the microphone filter form the first high-pass time constant while the transconductance of the field effect transistor 23, non-linear resistor 28, the base-emitter resistance of transistor 24, and capacitor 27 form the second time constant.

The capacitor 51, when engaged by switch 52, lower the gain of the circuit by providing negative feedback to the input. The feedback is created in resistor 91 and is isolated from the output by the cascode connected transistor 90.

The use of this attenuator, however, alters the frequency and damping factor of the filter since it changes the first time constant. Using a coupling resistor such as resistor 25 in FIG. 3 would change the second time constant, and consequently, the frequency and damping factor of the filter.

This circuit avoids the need for the capacitive attenuator by reducing the bias voltage and increasing the headroom. The variable resistor 34 controls the overall current in the microphone. When it is turned down, it exhibits a large resistance which reduces the current flow throughout the amplifier. Consequently, the voltages at points A and B are high, 30 and 35 volts or more respectively. When turned up, it exhibits a small resistance which increases the current flow throughout the amplifier. Consequently, the voltages at points A and B are low, 7 and 12 volts respectively. Consequently, resistor 34 has two complementary effects. When resistor 34 is turned up and the current through the amplifier is high, the amplifier can produce a larger output signal before clipping and the bias to the capsule is lower so that the capsule does not produce as large a signal. Thus, when the resistor 34 is turned up, it is in its large signal position. When resistor 34 is turned down, it is in its small signal position. The currents are lower so the amplifier clips at a low signal and the bias voltages are higher so that the capsule is more sensitive. The combination can product a 24 dB range in headroom, 12 dB due to sensitivity changes and 12 dB due to current changes.

Since some capsules require more than one bias voltage, a DC-to-DC converter 89 such as a charge pump provides the second voltage on filter capacitor 88. This voltage can be handled in two ways, both in the prior art Neumann microphones. One varies the voltage with a potentiometer, the other selects the voltage with a switch. The simplest converters produce voltages that are proportional to the input voltage with some fixed shortfall. Consequently the voltage on capacitor 88 is always about double the voltage that bias the field effect transistor 23. This produces the double cardioid pattern. Having no voltage on capacitor 88 produces the omnidirectional pattern, while having the same voltage on 88 as the bias to field effect transistor produces the cardioid pattern.

Asymmetrical Differential Amplifier

FIGS. 2–5 show differentially connected devices 103 and 108 or 23 and 24 with the transistors 108 and 24 having a fixed bias and no signal. However, differential applications can readily supply a second signal to transistors 108 and 24 as shown by the dotted lines in FIG. 2. The base of transistor 24 is driven by signal 112 instead of being grounded 111.

What is claimed is:

1. An audio amplifier having an input for producing a first output current including harmonics of the input signal comprising a first non-linear means having first, second, and third non-linear terminals for receiving said input on said first non-linear terminal, for producing said first output on said second terminal, and for controlling the flow of current from said second non-linear terminal to said third non-linear terminal as a function of the voltage from said first non-linear terminal to said third non-linear terminal;

a first resistive means connected to said third non-linear terminal that determines the operating point of said first non-linear means;

a first terminal of a capacitive network also connected to said third non-linear terminal;

a second non-linear means connected to a second terminal of said capacitive network; and a second resistive means connected to said second terminal of said capacitive means and second non-linear means that determines the operating point of said second non-linear means; wherein said second non-linear means has a non-linear characteristic fundamentally different from the non-linear characteristic of said first non-linear means so that said first and second non-linear characteristics do no significantly cancel the even harmonic production of said first or second non-linear means; and wherein the transductance ratio of said current flow to the input voltage of said input is higher at audio frequencies than at D.C.

2. The amplifier of claim 1 wherein said second non-linear means is a transistor means that produces a second output.

3. The amplifier of claim 1 wherein said first non-linear means is a field effect transistor.

4. The amplifier of claim 1 wherein said capacitive network includes a non-linear means exhibiting a non-linear resistance.

5. The amplifier of claim 1 wherein at least one of said first and second resistive means includes transistor means and said combination is used as a current source.

6. The amplifier of claim 1 wherein the current through said first and second resistive means is adjustable.

7. The amplifier of claim 1 wherein said first non-linear means is a field effect transistor;

said second non-linear means is a bipolar transistor that provides a second output;

said capacitive network includes a non-linear means exhibiting a non-linear resistance; and the current through said first and second resistive means is adjustable.

8. The amplifier of claim 1 which, for an input of a sine wave of some amplitude the output current, includes at least the first, second, and third harmonics wherein said second harmonic amplitude is 30 dB below the first harmonic amplitude and the third harmonic amplitude is approximately 50 dB below the first harmonic amplitude.

9. The amplifier of claim 1 including sense means connected to said output and a shunt means responsive to said sense means for increasing the current in said capacitive network when said first non-linear means has nearly no current flowing through it.

10. The amplifier of claim 1 wherein said first and second resistive means sets the current levels in said first and second non-linear means at different current levels to produce a bias shift in said capacitive network for input signals which cause clipping of the signal in said output.

11. A solid state audio amplifier for replicating vacuum tube harmonic structures and producing a balanced output in response to an input comprising:

a field effect transistor having gate, source, and drain terminals, wherein said gate is connected to said input and said drain is connected to a first terminal of said balanced output;

a bipolar transistor having emitter, base, and collector terminals, wherein said collector is connected to a second terminal of said balanced output;

a capacitive coupling means coupling said field effect transistor source terminal to said bipolar emitter terminal; wherein said bipolar transistor does not significantly cancel the even harmonic generation of said field effect transistor.

12. The solid state amplifier of claim 11 which includes a cascode bipolar transistor in series with an output.

13. The solid state amplifier of claim 11 also comprising bias means connected to said balanced output for supplying a bias voltage to said field effect transistor and said bipolar transistor.

14. The solid state amplifier of claim 13 having adjustable current source means connected to said field effect transistor source terminal and said bipolar transistor emitter terminal wherein for the adjustment of greater currents in said transistors lowers said bias voltage to said transistors.

15. The solid state amplifier of claim 13 having feedback means connected to said bipolar transistor collector terminal and said bias means.

16. The solid state amplifier of claim 14 having feedback means connected to said bipolar transistor collector terminal ad said bias means.

17. The solid state amplifier of claim 14 having a DC-to-DC converter that provides microphone capsule bias proportional to said bias voltage to said transistors.

18. The solid state amplifier of claim 11 which for an input of a sine wave of some amplitude the output current includes at least the first, second, and third harmonics wherein said second harmonic amplitude is 30 dB below the first harmonic amplitude and the third harmonic amplitude is approximately 50 dB below the first harmonic amplitude.

19. The solid state amplifier of claim 11 wherein said capacitive coupling means includes a non-linear means.

20. The solid state amplifier of claim 11 wherein said capacitive coupling means includes means for changing the time constant of said capacitive coupling.

21. An asymmetrical differential audio amplifier for amplifying an input signal and for producing harmonics of said input signal having a first transistor means having a first non-linear characteristic;

a second transistor means having a second non-linear characteristic fundamentally different than said first non-linear characteristic so that said first and second non-linear characteristics do not significantly cancel the even harmonic production of said first or second non-linear means;

capacitive coupling means for connecting said first and second transistor means in a differential manner;

first resistor means connected to said first transistor means for setting the operating point of said first transistor means; and second resistor means connected to said second transistor means for setting the operation point of said second transistor means.

* * * * *